United States Patent
Wu et al.

(10) Patent No.: US 11,763,721 B2
(45) Date of Patent: Sep. 19, 2023

(54) DISPLAY PANEL, METHOD FOR DRIVING SAME, AND DISPLAY APPARATUS

(71) Applicants: Yunnan Invensight Optoelectronics Technology Co., Ltd., Yunnan (CN); BOE Technology Group Co., Ltd., Beijing (CN)

(72) Inventors: Qian Wu, Beijing (CN); Pengcheng Lu, Beijing (CN); Zhijian Zhu, Beijing (CN); Chenyu Chen, Beijing (CN); Yunlong Li, Beijing (CN); Dongsheng Li, Beijing (CN); Wei Liu, Beijing (CN); Longfei Fan, Beijing (CN); Rongfei Chen, Beijing (CN); Dacheng Zhang, Beijing (CN); Yuanlan Tian, Beijing (CN)

(73) Assignees: Yunnan Invensight Optoelectronics Technology Co., Ltd., Yunnan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/683,734

(22) Filed: Mar. 1, 2022

(65) Prior Publication Data
US 2022/0293031 A1  Sep. 15, 2022

(30) Foreign Application Priority Data
Mar. 9, 2021  (CN) .......................... 202110256752.4

(51) Int. Cl.
*G09G 3/20* (2006.01)
*H01L 27/32* (2006.01)
(Continued)

(52) U.S. Cl.
CPC ......... *G09G 3/2003* (2013.01); *G09G 3/3225* (2013.01); *H10K 59/122* (2023.02);
(Continued)

(58) Field of Classification Search
CPC ... G09G 2300/0452; G09G 2300/0426; G09G 2300/0439; G09G 2300/0443;
(Continued)

(56) References Cited

U.S. PATENT DOCUMENTS

| 2010/0149204 A1* | 6/2010 | Han ........................ G09G 5/02 345/589 |
| 2011/0102313 A1* | 5/2011 | Hsieh .................... G02F 1/1679 427/559 |

(Continued)

FOREIGN PATENT DOCUMENTS

| CN | 103985729 A | 8/2014 |
| CN | 105679798 A | 6/2016 |

(Continued)

OTHER PUBLICATIONS

CN202110256752.4 first office action.

*Primary Examiner* — Dong Hui Liang
(74) *Attorney, Agent, or Firm* — IPRO, PLLC

(57) ABSTRACT

A display panel is provided. The display panel includes a driving back plate and a pixel layer disposed on a side of the driving back plate. The pixel layer includes a plurality of pixels, and the pixel includes m color sub-pixels for emitting color light and k white sub-pixels for emitting white light, wherein m and k are both integers greater than 1. The k white sub-pixels are configured to adjust the luminance of the pixel.

16 Claims, 4 Drawing Sheets

(51) Int. Cl.
*G09G 3/3225* (2016.01)
*H10K 59/38* (2023.01)
*H10K 59/122* (2023.01)
*H10K 59/35* (2023.01)

(52) U.S. Cl.
CPC ......... *H10K 59/351* (2023.02); *H10K 59/353* (2023.02); *H10K 59/38* (2023.02); *G09G 2300/0452* (2013.01)

(58) Field of Classification Search
CPC ......... G09G 2300/0465; G09G 3/3607; G09G 3/2003; G09G 3/2074; G09G 3/3208; G09G 3/3233; G09G 3/364; G09G 2320/0233; G09G 2320/0247; G09G 2340/0457; G09G 2330/10; H01L 27/3213; H01L 27/3246; H01L 27/3216; H01L 27/3211; H01L 27/3218; H01L 27/326; H01L 27/14603; H01L 27/14605; H10K 59/351; H10K 59/352; H10K 59/353; H10K 59/38; H10K 59/00; H10K 59/12; H10K 50/865; H10K 50/86

See application file for complete search history.

(56) References Cited

U.S. PATENT DOCUMENTS

| | | | |
|---|---|---|---|
| 2013/0235097 A1* | 9/2013 | Eguchi | H04N 13/324 345/697 |
| 2014/0225815 A1 | 8/2014 | Jung et al. | |
| 2016/0035288 A1* | 2/2016 | Chu Ke | G09G 3/2074 345/690 |
| 2016/0197104 A1* | 7/2016 | Kim | H01L 27/1251 257/347 |
| 2016/0300520 A1* | 10/2016 | Wang | G09F 9/30 |
| 2017/0179438 A1* | 6/2017 | Xu | H01L 27/3213 |
| 2017/0213496 A1 | 7/2017 | Hsu | |
| 2017/0278904 A1* | 9/2017 | Park | H01L 27/3216 |
| 2019/0073938 A1 | 3/2019 | Shi | |
| 2021/0193033 A1 | 6/2021 | Tan et al. | |

FOREIGN PATENT DOCUMENTS

| | | |
|---|---|---|
| CN | 106023819 A | 10/2016 |
| CN | 107851418 A | 3/2018 |
| CN | 110993673 A | 4/2020 |
| CN | 111834423 A | 10/2020 |
| WO | 2020233548 A1 | 11/2020 |

\* cited by examiner

DISPLAY PANEL, METHOD FOR DRIVING SAME, AND DISPLAY APPARATUS

CROSS-REFERENCE TO RELATED APPLICATION

This application claims priority to Chinese patent application No. 202110256752.4, filed on Mar. 9, 2021 and entitled "DISPLAY APPARATUS, DISPLAY PANEL AND DRIVING METHOD THEREOF", the entire content of which is incorporated herein by reference.

TECHNICAL FIELD

The present disclosure relates to a display panel, a method for driving the same, and a display apparatus.

BACKGROUND

Currently, organic light-emitting diode (OLED) display panels are widely applied. Micro-OLED display panels have excellent display characteristics, such as high resolution, high brightness, rich colors, low driving voltage, fast response and low power consumption, and thus have a broad development prospect in the display field.

SUMMARY

Embodiments of the present disclosure provide a display panel, a method for driving the same and a display apparatus.

In a first aspect, a display panel is provided. The display panel includes: a driving back plate, and a pixel layer disposed on a side of the driving back plate, wherein the pixel layer includes a plurality of pixels, each pixel including m color sub-pixels for emitting color light and k white sub-pixels for emitting white light, the k white sub-pixels being configured to adjust luminance of the pixel, wherein m and k are both integers greater than 1.

In some embodiment, light-emitting surfaces of at least two of the k white sub-pixels have unequal areas.

In some embodiment, the k white sub-pixels include a first white sub-pixel and (k−1) second white sub-pixels, and an area of a light-emitting surface of the first white sub-pixel is smaller than an area of a light-emitting surface of the second white sub-pixel.

In some embodiment, the area of the light-emitting surface of the first white sub-pixel is not greater than 20% of a sum of the areas of the light-emitting surfaces of the k white sub-pixels.

In some embodiment, the m color sub-pixels and the (k−1) second white sub-pixels are arranged around the first white sub-pixel.

In some embodiment, the area of the light-emitting surface of the second white sub-pixel equals an area of a light-emitting surface of the color sub-pixel.

In some embodiment, an orthographic projection of the pixel onto the driving back plate, orthographic projections of the color sub-pixels onto the driving back plate and orthographic projections of the white sub-pixels onto the driving back plate are all rectangular.

In some embodiment, the m color sub-pixels and the second white sub-pixels are arranged in a first direction, and the first white sub-pixel and the second white sub-pixels are arranged in a second direction, the first direction being perpendicular to the second direction.

In some embodiment, an area of a light-emitting surface of any one of the m color sub-pixels equals a sum of the areas of the light-emitting surfaces of the k white sub-pixels.

In some embodiment, an orthographic projection of the pixel onto the driving back plate, orthographic projections of the color sub-pixels onto the driving back plate and orthographic projections of the white sub-pixels onto the driving back plate are all rectangular.

In some embodiment, the sub-pixels in the pixel are arranged in a plurality of rows in a second direction, and a plurality of sub-pixels are arranged in each row in a first direction.

In some embodiment, an area of a light-emitting surface of any one of the m color sub-pixels equals a sum of the areas of the light-emitting surfaces of the k white sub-pixels.

In some embodiment, shapes of orthographic projections of the color sub-pixels onto the driving back plate are all polygons, orthographic projections of the k white sub-pixels onto the driving back plate form the polygon, and the polygon has more than 4 edges.

In some embodiment, the m color sub-pixels include a red sub-pixel, a green sub-pixel and a blue sub-pixel.

In some embodiment, the pixel layer includes: a pixel defining layer disposed on a side of the driving back plate and provided with a plurality of pixel openings; and a plurality of light-emitting devices, wherein each light-emitting device is disposed in one pixel opening, and each of the color sub-pixels and the white sub-pixels includes one the light-emitting device.

In some embodiment, the light-emitting device is a white light emitting device, and the pixel layer further includes: a color film layer disposed on sides of the plurality of light-emitting devices distal from the driving back plate, wherein the color film layer includes a plurality of light-transmitting portions, and the plurality of light-transmitting portions are in one-to-one correspondence with the plurality of light-emitting devices; wherein the plurality of light-transmitting portions include a filter portion and a transparent portion, the color sub-pixel further includes the filter portion, and the white sub-pixel further includes the transparent portion.

In as second aspect, a method for driving a display panel is provided. The display panel includes a driving back plate and a pixel layer disposed on a side of the driving back plate, the pixel layer including a plurality of pixels, the pixel including m color sub-pixels and k white sub-pixels, wherein the k white sub-pixels are configured to adjust luminance of the pixel, m and k being both integers greater than 1; the method including: controlling at least one of the plurality of pixels to emit light, such that the color sub-pixels in the at least one pixel emit color light, and the white sub-pixels in the at least one pixel emit white light.

In some embodiment, controlling at least one of the plurality of pixels to emit light includes: in a first display mode, controlling the at least one of the plurality of pixels to emit light in a first manner, wherein emitting light by any one pixel in the first manner includes: emitting light by the color sub-pixels in the pixel, emitting light by part of the white sub-pixels in the pixel, and turning off the remaining white sub-pixels; and in a second display mode, controlling the at least one of the plurality of pixels to emit light in a second manner, wherein emitting light by any one pixel in the second manner includes: emitting light by at least one color sub-pixel and the k white sub-pixels in the pixel.

In some embodiment, the pixel has n grayscales, luminance of the pixel at an $i^{th}$ grayscale is lower than the luminance of the pixel at an $(i+1)^{th}$ grayscale, wherein the $i^{th}$ grayscale and the $(i+1)^{th}$ grayscale are any two adjacent grayscales of the n grayscales, n is a natural number not less than 256, and i is a natural number less than n; and the grayscale of any one pixel when emitting light in the first manner is not greater than 32.

In a third aspect, a display apparatus is provided. The display panel includes the display panel as described in the first aspect or any optional embodiment in the first aspect.

DETAILED DESCRIPTION

Figure 1:
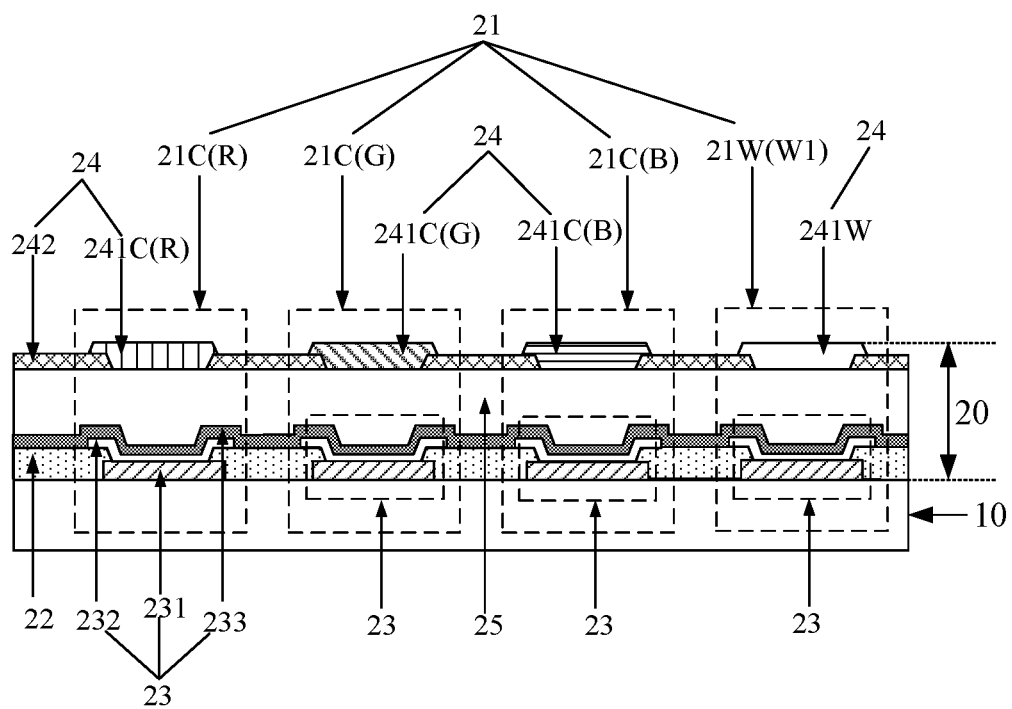
FIG. 1 is a schematic structural diagram of a display panel according to an embodiment of the present disclosure.

Hereinafter, the embodiments of the present disclosure are described with reference to the accompanying drawings. However, the following embodiments can be implemented in various ways and shall not be construed as limited to the embodiments set forth herein. These embodiments are provided to make the present disclosure compressive and complete, and to exemplarily convey the concept of the present disclosure to those skilled in the art. Similar reference numerals in the drawings denote the same or similar structures, and thus their detailed descriptions are omitted. In addition, the accompanying drawings are merely used for schematic illustration but are not necessarily drawn to scale.

The terms "one", "a/an", "the", "said", and "at least one" are used to indicate the presence of one or more elements/components, etc. The terms "including/comprising" and "having" are used to indicate an opening inclusion and indicate that there may be other elements/components, etc., in addition to the listed elements/components, etc. The terms "first", "second" and "third" are merely used as reference only, not as a restriction on the number, sequence and importance of the objects.

A light-emitting device in an OLED display panel is an OLED, and color display of the OLED display panel can usually be realized by using a white light OLED together with a color film layer. However, the color film layer has a strong effect of absorbing light in a non-transmitted waveband thereof, which leads to low brightness of the OLED display panel.

In addition, the emission spectrum of the OLED is easily affected by the driving voltage. Usually, the OLED has different emission spectra in different grayscales, which easily affects the color performance of the OLED display panel and may especially lead to color shift of the OLED display panel using the white light OLED together with the color film layer. For example, in the case of a low driving voltage, blue light in the emission spectrum of the white light OLED almost disappears, which indicates the color performance of blue light is poor in a low grayscale, thereby easily resulting in failure of the OLED display panel to display white.

The embodiments of the present disclosure provide a display panel, a method for driving the same and a display apparatus. The display panel may be an OLED display panel, for example, a micro OLED display panel. In the display panel, a pixel includes a plurality of color sub-pixels for emitting color light and a plurality of white sub-pixels for emitting white light, and the plurality of white sub-pixels are configured to adjust the luminance of the pixel. Therefore, the luminance of the pixel may be adjusted by the white sub-pixels in the pixel, such that the luminance of the pixel meets a luminance requirement of a corresponding grayscale, which helps prevent the pixel from color shift and thus prevents the display panel from color shift, compared with the case of adjusting the luminance of the pixel by adjusting a driving voltage. In addition, white light emitted by the white sub-pixels may compensate for the luminance of the pixel to which the white sub-pixels belong, to improve the luminance of the pixel, thereby improving the brightness of the display panel.

The embodiments of the display panel of the present disclosure are described below with reference to the accompanying drawings.

FIG. 1 is a schematic structural diagram of a display panel according to an embodiment of the present disclosure. As shown in FIG. 1, the display panel includes a driving back plate 10 and a pixel layer 20 disposed on a side of the driving back plate 10.

The pixel layer 20 includes a plurality of pixels 21, and each pixel 21 includes a plurality of sub-pixels. The sub-pixels may emit light independently. The plurality of sub-pixels in at least one pixel 21 includes m color sub-pixels 21C and k white sub-pixels 21W, and m and k are both integers greater than 1.

The color sub-pixels 21C emit color light, and the white sub-pixels 21W emit white light. The k white sub-pixels 21W in any pixel 21 are configured to adjust the luminance of the pixel 21.

In summary, in the display panel provided by the embodiment of the present disclosure, each pixel includes the m color sub-pixels for emitting color light and the k white sub-pixels for emitting emit white light, and the k white sub-pixels are configured to adjust the luminance of the pixel. Therefore, the luminance of the pixel can be adjusted by the k white sub-pixels, such that the luminance of the pixel meets the luminance requirement of a corresponding grayscale, which helps prevent the pixel from color shift and thus prevents the display panel from color shift, compared with the case of adjustment of the luminance of the pixel by adjusting a driving voltage. In addition, white light emitted by the white sub-pixels may compensate for the luminance of the pixel to which the white sub-pixels belong, to improve the luminance of the pixel, thereby improving the brightness of the display panel.

Optionally, in the pixel 21, light-emitting surfaces of at least two of the k white sub-pixels 21W have unequal areas. In this way, the luminance of the pixel 21 may be adjusted by controlling at least one of the k white sub-pixels 21W to emit light according to the luminance requirement of a grayscale to be matched with the pixel 21. For example, when the grayscale to be matched with the pixel 21 is low, the white sub-pixel 21W of which the light-emitting surface has a smaller area in the k white sub-pixels 21W in the pixel 21 may be controlled to emit light, so as to adjust the luminance of the pixel 21. When the grayscale to be matched with the pixel 21 is high, the white sub-pixel 21W of which the light-emitting surface has a larger area in the k white sub-pixels 21W in the pixel 21 may be controlled to emit light, so as to adjust the luminance of the pixel 21. Optionally, according to different grayscales to be matched with the pixel 21 and different areas of the light-emitting surfaces of the k white sub-pixels 21W in the pixel 21, the luminance of the pixel 21 may also be adjusted by adjusting the number of the white sub-pixels 21W that emit light in the pixel 21, which is not limited in the embodiments of the present disclosure.

Optionally, in the pixel 21, the k white sub-pixels 21W include a first white sub-pixel W1 and a second white sub-pixel W2, and the area of the light-emitting surface of the first white sub-pixel W1 is smaller than that of the light-emitting surface of the second white sub-pixel W2. For example, the k white sub-pixels 21W include one first white sub-pixel W1 and (k−1) second white sub-pixels W2, and the first white sub-pixel W1 may be the white sub-pixel with the smallest area of light-emitting surface in the k white sub-pixels 21W.

Optionally, in the pixel 21, the area of the light-emitting surface of the first white sub-pixel W1 is not greater than 20% of the sum of the areas of the light-emitting surfaces of the k white sub-pixels 21W. For example, the area of the light-emitting surface of the first white sub-pixel W1 is 10% of the sum of the areas of the light-emitting surfaces of k white sub-pixels 21W. In this way, the area of the light-emitting surface of the first white sub-pixel W1 may not be too large, which ensures that the first white sub-pixel W1 can compensate for the luminance of the pixel 21 at the lowest grayscale, such that the luminance of the pixel 21 at the lowest grayscale can meet the luminance requirement of the lowest grayscale.

Optionally, the m color sub-pixels 21C in the pixel 21 include a red sub-pixel R for emitting red light, a green sub-pixel G for emitting green light and a blue sub-pixel B for emitting blue light. The sub-pixels in the pixel 21 may be arranged in different ways, which are introduced below.

Figure 2:
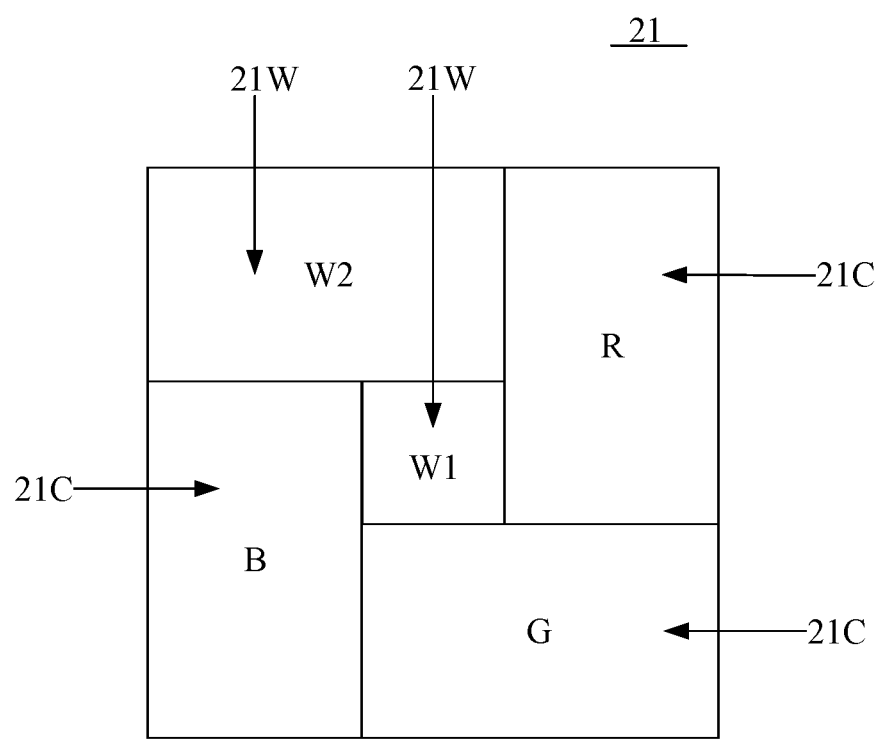
FIG. 2 is a schematic diagram showing arrangement of sub-pixels in a pixel according to an embodiment of the present disclosure.

In a first optional implementation, referring to FIG. 2, FIG. 2 is a schematic diagram showing arrangement of sub-pixels in a pixel 21 according to an embodiment of the present disclosure. FIG. 2 is illustrated by taking an explanation in which the m color sub-pixels 21C in the pixel 21 include a red sub-pixel R, a green sub-pixel G and a blue sub-pixel B, and the k white sub-pixels 21W in the pixel 21 include one first white sub-pixel W1 and one second white sub-pixel W2. As shown in FIG. 2, in the pixel 21, the m color sub-pixels 21C and the (k−1) second white sub-pixels W2 (that is, one second white sub-pixel W2) are arranged around the first white sub-pixel W1, and the center of the first white sub-pixel W1 may coincide with the center of the pixel 21. Optionally, the light-emitting surfaces of the m color sub-pixels 21C have an equal area, and the area of the light-emitting surface of the second white sub-pixel W2 equals that of the light-emitting surface of any one color sub-pixel 21C. An orthographic projection of the pixel 21 onto the driving back plate 10, an orthographic projection of any color sub-pixel 21C onto the driving back plate 10 and an orthographic projection of any white sub-pixel 21W onto the driving back plate 10 may all be rectangular.

Figure 3:
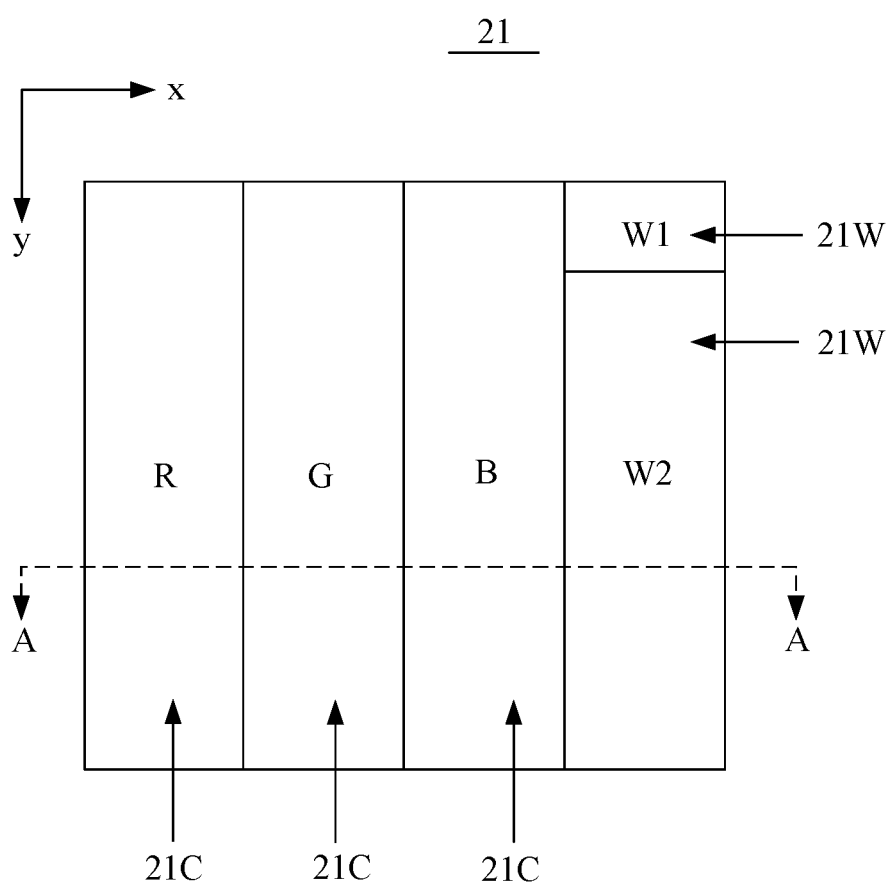
FIG. 3 is a schematic diagram showing another arrangement of sub-pixels in a pixel according to an embodiment of the present disclosure.

In a second optional implementation, referring to FIG. 3, FIG. 3 is a schematic diagram showing another arrangement of sub-pixels in a pixel 21 according to an embodiment of the present disclosure. FIG. 3 is illustrated by taking an explanation in which the m color sub-pixels 21C in the pixel 21 include a red sub-pixel R, a green sub-pixel G and a blue sub-pixel B, and the k white sub-pixels 21W in the pixel 21 include one first white sub-pixel W1 and one second white sub-pixel W2. As shown in FIG. 3, in the pixel 21, the m color sub-pixels 21C and the second white sub-pixels W2 are arranged in a first direction x, and the first white sub-pixel W1 and the second white sub-pixel W2 are arranged in a second direction y, and the first direction x is perpendicular to the second direction y. Optionally, the light-emitting surfaces of the m color sub-pixels 21C have an equal area, and the area of any color sub-pixel 21C equals the sum of the areas of the light-emitting surfaces of the k white sub-pixels 21W (that is, one first white sub-pixel W1 and one second white sub-pixel W2). An orthographic projection of the pixel 21 onto the driving back plate 10, an orthographic projection of any color sub-pixel 21C onto the driving back plate 10 and an orthographic projection of any white sub-pixel 21W onto the driving back plate 10 may all be rectangular.

Figure 4:
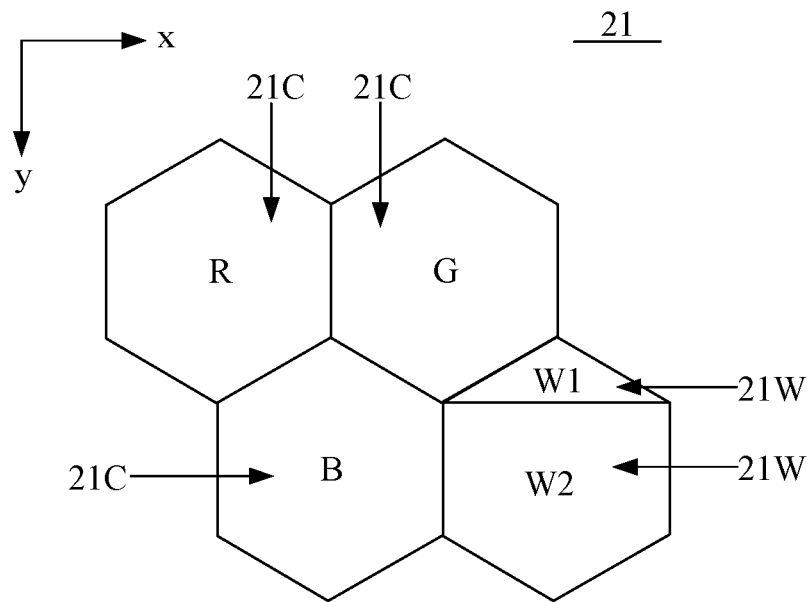
FIG. 4 is a schematic diagram showing yet another arrangement of sub-pixels in a pixel according to an embodiment of the present disclosure.

In a third optional implementation, referring to FIG. 4, FIG. 4 is a schematic diagram showing yet another arrangement of sub-pixels in a pixel 21 according to an embodiment of the present disclosure. FIG. 4 is illustrated by taking an explanation in which the m color sub-pixels 21C in the pixel 21 include a red sub-pixel R, a green sub-pixel G and a blue sub-pixel B, and the k white sub-pixels 21W in the pixel 21 include one first white sub-pixel W1 and one second white sub-pixel W2. As shown in FIG. 4, the m color sub-pixels 21C and the k white sub-pixels 21W in the pixel 21 are arranged in a plurality of rows in a second direction y; and in each row, a plurality of sub-pixels are arranged in a first direction x. The sub-pixels in the plurality of rows are staggered from each other. Optionally, the light-emitting surfaces of the m color sub-pixels 21C have an equal area, and the area of the light-emitting surface of any color sub-pixel 21C equals the sum of the areas of the light-emitting surfaces of the k white sub-pixels 21W (that is, one first white sub-pixel W1 and one second white sub-pixel W2). An orthographic projection of any color sub-pixel 21C onto the driving back plate 10 is polygonal, and orthographic projections of the k white sub-pixels 21W onto the driving back plate 10 form the polygon, and the polygon has at least 4 edges. For example, the polygon is a pentagon, a hexagon, or the like. As shown in FIG. 4, an orthographic projection of the red sub-pixel R onto the driving back plate 10, an orthographic projection of the green sub-pixel G onto the driving back plate 10 and an orthographic projection of the blue sub-pixel B onto the driving back plate 10 are all orthohexagonal, an orthographic projection of the first white sub-pixel W1 onto the driving back plate 10 is in the shape of an isosceles triangle, and an orthographic projection of the second white sub-pixel W2 onto the driving back plate 10 is pentagonal, and the orthographic projection of the first white sub-pixel W1 onto the driving back plate 10 and the orthographic projection of the second white sub-pixel W2 onto the driving back plate 10 form a regular hexagon, and four congruent regular hexagons are shown in FIG. 4.

Optionally, the display panel has a row direction and a column direction, the row direction may be an extending direction of a gate line in the display panel and the column direction may be an extending direction of a data line in the display panel. In the second and third optional implementations described above, the first direction x may be parallel to the row direction and the second direction y may be parallel to the column direction; alternatively, the first direction x may be parallel to the column direction and the second direction y may be parallel to the row direction, which is not be limited in the embodiments of the present disclosure.

FIGS. 2 to 4 are merely examples of arrangement of the sub-pixels in the pixel 21. In other embodiments, the sub-pixels in the pixel 21 may be arranged in other forms. The orthographic projection of the pixel 21 onto the driving back plate 10 may also be circular or elliptical, or in other regular or irregular shapes, and the orthographic projection of each sub-pixel in the pixel 21 onto the driving back plate 10 may also be circular or elliptical or in other regular or irregular shapes. The arrangement of the sub-pixels in the pixel 21, the orthographic projection of the pixel 21 onto the driving back plate 10, and the orthographic projection of each sub-pixel in the pixel 21 onto the driving back plate 10 are not limited in the embodiments of the present disclosure. FIG. 1 may be a sectional view of A-A in FIG. 3.

Continuing to refer to FIG. 1, the pixel layer 20 includes a pixel defining layer 22 and a plurality of light-emitting devices 23. The pixel defining layer 22 is provided with a plurality of pixel openings, and each light-emitting device 23 is disposed in one pixel opening 23. For example, the plurality of light-emitting devices 23 are disposed in the plurality of pixel openings in one-to-one correspondence. The plurality of light-emitting devices 23 may be arranged in the same layer in an array, each of the color sub-pixel 21C and the white sub-pixel 21W includes one light-emitting device 23, and any two sub-pixels include different light-emitting devices 23. For example, in the pixel 21, each of the red sub-pixel R, the green sub-pixel G, the blue sub-pixel B, the first white sub-pixel W1 and the second white sub-pixel W2 includes one light-emitting device 23.

In an optional embodiment, the light-emitting device 23 is an electroluminescent device, and the width of an orthographic projection of the light-emitting device 23 onto the driving back plate 10 may be less than 100 μm. Therefore, the light-emitting device 23 may be a micro device. For example, the light-emitting device 23 is a micro OLED or a micro quantum dot light emitting diode (QLED). As shown in FIG. 1, the light-emitting device 23 includes a first electrode 231, a light-emitting functional layer 232 and a second electrode 233 that are sequentially laminated in a direction going away from the driving back plate 10.

The first electrode 231 is disposed on the side of the pixel defining layer 22 proximal to the driving back plate 10. The first electrodes 231 in the light-emitting devices 23 are independent of one another. An orthographic projection of the first electrode 231 in each light-emitting device 23 onto the driving back plate 10 covers an orthographic projection of the corresponding pixel opening onto the driving back plate 10, and at least part of the first electrode 231 in each light-emitting device 23 is exposed through the corresponding pixel opening. Optionally, the first electrode 231 is an anode, and may be of a single-layer structure or a multi-layer structure. The first electrode 231 may be made from one or more of conductive metal, metal oxide and an alloy.

The light-emitting functional layer 232 is disposed on the side of the pixel defining layer 22 distal from the driving back plate 10. The light-emitting functional layers 232 in the light-emitting devices 23 may be independent of one another. An orthographic projection of the light-emitting functional layer 232 in each light-emitting device 23 onto the driving back plate 10 covers an orthographic projection of the corresponding pixel opening onto the driving back plate 10, and at least part of the light-emitting functional layer 232 in each light-emitting device 23 is disposed in the corresponding pixel opening. Optionally, the light-emitting functional layer 232 includes a hole inject layer, a hole transport layer, a luminescent material layer, an electron transport layer and an electron inject layer that are sequentially laminated in the direction going away from the driving back plate 10. Holes injected in the hole inject layer may reach the luminescent material layer through the hole transport layer, and electrons injected in the electron inject layer may reach the luminescent material layer through the electron transport layer. The holes and the electrons are recombined into excitons in the luminescent material layer, and photons are radiated by the excitons to generate visible light, such that the light-emitting functional layer 232 emits light. In some embodiments, the light-emitting functional layers 232 in at least two light-emitting devices 23 may share at least one film layer, such that the process difficulty is reduced. For example, at least two light-emitting devices 23 may share at least one of the hole inject layer, the hole transport layer, the electron transport layer and the electron inject layer, which is not limited in the embodiments of the present disclosure.

The second electrode 233 may cover the light-emitting functional layer 232. The second electrode 233 may be an entire surface electrode, the light-emitting devices 23 may share the same second electrode 233, and the second electrode 233 covers the light-emitting functional layers 232 of the light-emitting devices 23 and the pixel defining layer 22. Optionally, the second electrode 233 is a cathode, and may be of a single-layer structure or a multi-layer structure. The second electrode 233 may be made from one or more of conductive metal, metal oxide and an alloy.

For the ease of description, the color of light emitted by a light-emitting device is referred to as the light-emitting color of the light-emitting device. In an embodiment of the present disclosure, the light-emitting colors of the light-emitting devices 23 in the display panel may be the same, for example, the colors of light emitted by the light-emitting devices 23 in the display panel are all blue or white. Alternatively, the light-emitting colors of at least two light-emitting devices 23 in the display panel are different. For example, the light-emitting devices 23 in the display panel include a red light emitting device, a green light emitting device, a blue light emitting device and a white light emitting device, and the color of light emitted by the red light emitting device is red, the color of light emitted by the green light emitting device is green, the color of light emitted by the blue light emitting device is blue and the color of light emitted by the white light emitting device is white. In the case that the light-emitting colors of the light-emitting devices 23 in the display panel are the same, for example, in the case that the light-emitting devices 23 in the display panel are all white light emitting devices, a color film layer may be used together to achieve color display.

In an embodiment of the present disclosure, an illustration is provided by taking an example in which the light-emitting devices 23 in the display panel are all white light emitting devices. Continuing to refer to FIG. 1, the pixel layer 20 further includes a color film layer 24 disposed on the sides of the light-emitting devices 23 distal from the driving back plate 10. The color film layer 24 includes a plurality of light-transmitting portions 241, the plurality of light-transmitting portions 241 are in one-to-one correspondence with the plurality of light-emitting devices 23, and light emitted by each light-emitting device 23 may exit from the corresponding light-transmitting portion 241. Optionally, the color film layer 24 further includes a light-shielding portion 242, and a plurality of through holes in one-to-one correspondence with the plurality of pixel openings of the pixel defining layer 21 are formed in the light-shielding portion 242. An orthographic projection of each through hole onto the driving back plate 10 is at least partially overlapped with an orthographic projection of the corresponding pixel opening onto the driving back plate 10, and the plurality of light-transmitting portions 241 are arranged in the plurality of through holes in one-to-one correspondence.

In the embodiment of the present disclosure, the plurality of light-transmitting portions 241 in the color film layer 24 may include a plurality of filter portions 241C and a plurality of transparent portions 241W, each color sub-pixel 21C further includes one filter portion 241C, and each white sub-pixel 21W further includes one transparent portion 241W. Each filter portion 241C may allow light of one color to transmit and block light of other colors (that is, filter out light of other colors), and the transparent portion 241W may allow white light to transmit. For example, the plurality of filter portions 241C in the color film layer 24 include a red light filter portion R, a green light filter portion G and a blue light filter portion B. The red light filter portion R may filter out light other than red light and allow red light to transmit, the green light filter portion G may filter out light other than green light and allow green light to transmit, and the blue light filter portion B may filter out light other than blue light and allow blue light to transmit.

In the embodiment of the present disclosure, in the case that the light-emitting devices 23 in the display panel are all white light emitting devices, the light-emitting devices 23 and the filter portions 241C cooperate to realize light emission of the color sub-pixels 21C, and the light-emitting devices 23 and the transparent portions 241W realize light emission of the white sub-pixels 21W. For example, the red sub-pixel R includes the light-emitting device 23 and the red light filter portion R, and the red light filter portion R may filter white light emitted by the light-emitting device 23 and allow red light to transmit, such that the red sub-pixel R may emit red light. The green sub-pixel G includes the light-emitting device 23 and the green light filter portion G, and the green light filter portion G may filter white light emitted by the light-emitting device 23 and allow green light to transmit, such that the green sub-pixel R may emit green light. The blue sub-pixel B includes the light-emitting device 23 and the blue light filter portion B, and the blue light filter portion B may filter white light emitted by the light-emitting device 23 and allow blue light to transmit, such that the blue sub-pixel B may emit blue light. The white sub-pixel 21W includes the light-emitting device 23 and the transparent portion 241W, and the transparent portion 241W may allow white light emitted by the light-emitting device 23 to transmit, such that the white sub-pixel 21W may emit white light.

In the embodiments of the present disclosure, an illustration is provided by taking an example in which the color film layer 24 includes a filter portion 241C and a transparent portion 241W. In some embodiments, the color film layer 24 may include the filter portion 241C but not includes the transparent portion 241W, the white sub-pixel 21W may only include the light-emitting device 23, and an opening may be formed at the position where the transparent portion 241W is provided to allow white light emitted by the light-emitting device 23 to transmit. Since the pixel 21 includes the white sub-pixel 21W, and the white sub-pixel 21W may compensate for the luminance of the pixel 21, the white sub-pixel 21W may make up for luminance loss caused by the color film layer 24 and improve the luminance of the pixel 21.

In an optional embodiment, the pixel layer 20 further includes an encapsulation structure 25 disposed on the side of the light-emitting device 23 distal from the driving back plate 10, and the color film layer 24 is disposed on the side of the encapsulation structure 25 distal from the driving back plate 10. The encapsulation structure 25 may cover the light-emitting device 23 and is configured to prevent water and oxygen in outside air from entering the display panel to erode the light-emitting device 23. That is, the encapsulation structure 25 is configured to protect the light-emitting device 23 against external erosion.

Optionally, the encapsulation structure 25 is a thin-film encapsulation (TFE) structure, including an inorganic layer and an organic layer that are alternately laminated. The inorganic layer is configured to prevent water and oxygen from entering the display panel, and the organic layer is configured to ensure the flexibility of the display panel. Exemplarily, the encapsulation structure 25 includes a first inorganic layer, an organic layer and a second inorganic layer. The first inorganic layer covers the side of the light-emitting device 23 distal from the driving back plate 10, and the organic layer is disposed on the side of the first inorganic layer distal from the driving back plate 10. An orthographic projection of the organic layer onto the driving back plate 10 falls within an orthographic projection of the first inorganic layer onto the driving back plate 10. The second inorganic layer may cover the organic layer and the part, not covered with the organic layer, of the first inorganic layer.

In the embodiments of the present disclosure, the driving back plate 10 may include a driving circuit configured to drive the light-emitting device 23 to emit light. The driving back plate 10 may include a display region and a peripheral region, the peripheral region may surround the display region, and the pixels 21 are disposed in the display region. Optionally, a small number of pixels are also provided in the peripheral region for signal buffering. The driving circuit may include a pixel circuit and a peripheral circuit, the number of the pixel circuits may equal that of the light-emitting devices 23, the pixel circuits may be connected to the light-emitting devices 23 in one-to-one correspondence, and each pixel circuit is configured to control the corresponding light-emitting device 23 to emit light. The pixel circuits may be disposed in the display region, for example, the pixel circuits may be 7T1C circuits, 7T2C circuits, 6T1C circuits or 6T2C circuits, as long as the pixel circuits can drive the light-emitting devices 23 to emit light. nTmC means that one pixel circuit includes n transistors (represented by the letter "T") and m capacitors (represented by the letter "C"). The peripheral circuits may be disposed in the peripheral region. The peripheral circuits are connected to the pixel circuits, and are configured to input driving signals into the pixel circuits, such that the pixel circuits control the corresponding light-emitting devices 23 to emit light. Optionally, the peripheral circuit includes a gate driving circuit and a light-emitting control circuit, and may further include other circuits, which is not limited in the embodiments of the present disclosure.

In an optional embodiment, the light-emitting device 23 is a micro OLED device, the driving back plate 10 is a silicon substrate, and the driving circuit is integrated in the silicon substrate. For example, the silicon substrate is made from monocrystalline silicon or high-purity silicon, and the driving circuit is formed on the silicon substrate by a semiconductor process. The driving circuit includes a transistor. An active layer (i.e. a semiconductor layer) and an electrode of the transistor may be formed on the silicon substrate by a doping process, an insulating layer may be formed by a silicon oxidation process, and a conductive layer for electrical connection between a wire and the transistor may be formed by a sputtering process. In some embodiments, the driving back plate 10 may include a base substrate and the driving circuit disposed on the base substrate. The active layer, the gate, the source and the drain of the transistor in the driving circuit may be formed by a photo-etching process. The base substrate may be a rigid substrate or a flexible substrate. The rigid substrate is, for example, a glass substrate, and the flexible substrate is, for example, a polyimide (PI) substrate.

In summary, in the display panel provided by the embodiment of the present disclosure, the pixel includes the m color sub-pixels for emitting color light and the k white sub-pixels for emitting white light. Therefore, white light emitted by the white sub-pixels may compensate for the luminance of the pixel to which the white sub-pixels belong, to improve the luminance of the pixel, thereby improving the brightness of the display panel.

In addition, in general, the current density of the light-emitting device needs to be adjusted by adjusting the driving voltage of the light-emitting device, so as to adjust the luminance of the sub-pixel, thereby adjusting the luminance of the pixel. However, adjustment of the current density of the light-emitting device may easily affect the emission spectrum of the light-emitting device, resulting in color shift of the pixel. For example, the current density of the light-emitting device is reduced by adjusting the driving voltage of the light-emitting device, so as to reduce the luminance of the sub-pixel, such that the sub-pixel can meet the luminance requirement of low grayscale. However, blue light in the emission spectrum of the light-emitting device may decrease or even disappear when the current density of the light-emitting device is reduced, which may lead to color shift of the pixel. In the embodiment of the present disclosure, the luminance of the pixel may be adjusted by the white sub-pixels in the pixel, such that the luminance of the pixel meets the luminance requirement of the corresponding grayscale, without adjusting the driving voltage of the light-emitting device, which helps prevent the pixel from color shift and improve the display effect of the display panel. For example, the luminance of the pixel can be reduced by reducing the number of the white sub-pixels that emit light in the pixel, such that the pixel can meet the luminance requirement of low grayscale.

The above descriptions introduce the embodiment of the display panel in the present disclosure, and an embodiment of a method for driving the display panel is introduced below. The display panel may be a display panel provided by any one of the above embodiments. Reference may be made to the above embodiments of the display panel for the structure of the display panel, which is not described in detail below.

An embodiment of the present disclosure provides a method for driving a display panel. The method includes: controlling at least one pixel in the display panel to emit light, such that color sub-pixels in the pixel emit color light, and white sub-pixels in the pixel emit white light. The k white sub-pixels in any pixel are configured to adjust the luminance of the pixel, such that the luminance of the pixel meets a luminance requirement of a corresponding grayscale.

Exemplarily, a first pixel is any pixel in the display panel, and an explanation is provided by taking an example in which the first pixel is controlled to emit light. Driving voltages may be applied, by a driving circuit, to the color sub-pixels and the white sub-pixels in the first pixel, such that the color sub-pixels emit color light and the white sub-pixels emit white light. The color sub-pixels and the white sub-pixels each include a light-emitting device, and applying the driving voltage to any one of the color sub-pixels and the white sub-pixels is to apply a driving voltage to the light-emitting device in the sub-pixel.

In an optional embodiment, when the display panel has a first display mode and a second display mode, controlling at least one pixel in the display panel to emit light includes: in the first display mode, controlling at least one pixel in the display panel to emit light in a first manner; and in the second display mode, controlling at least one pixel in the display panel to emit light in a second manner. Emitting light by any pixel in the first manner includes: emitting light by the color sub-pixels in the pixel, emitting light by part of the white sub-pixels in the pixel, and turning off the remaining white sub-pixels. Emitting light by any pixel in the second manner includes: emitting light by at least one color sub-pixel and the k white sub-pixels in the pixel.

Controlling the first pixel to emit light is taken as an example for explanation. In the first display mode, all of the m color sub-pixels in the first pixel may be controlled to emit light, and part of the k white sub-pixels in the first pixel may be controlled to emit light, while the remaining white sub-pixels may be turned off. In the second display mode, all of the m color sub-pixels and the k white sub-pixels in the first pixel may be controlled to emit light. For example, the m color sub-pixels in the first pixel include a red sub-pixel R, a green sub-pixel G and a blue sub-pixel B, and the k white sub-pixels in the first pixel include one first white sub-pixel W1 and one second white sub-pixel W2. In the first display mode, all of the red sub-pixel R, the green sub-pixel G, the blue sub-pixel B and the first white sub-pixel W1 in the first pixel may be controlled to emit light, and the second white sub-pixel W2 in the first pixel may be controlled to be turned off. In the second display mode, all of the red sub-pixel R, the green sub-pixel G, the blue sub-pixel B, the first white sub-pixel W1 and the second white sub-pixel W2 in the first pixel may be controlled to emit light.

In the embodiment of the present disclosure, each pixel in the display panel has n grayscales, each grayscale corresponds to one luminance, the luminance corresponding to a grayscale may be a luminance requirement of the grayscale, and the display panel may display screens of the n grayscales. An $i^{th}$ grayscale and an $(i+1)^{th}$ grayscale are any two adjacent grayscales of the n grayscales, and the luminance of each pixel at the $i^{th}$ grayscale is lower than the luminance of the pixel at the $(i+1)^{th}$ grayscale, n is a natural number not less than 256, and i is a natural number less than n. The grayscale of any pixel that emits light in the first manner is not greater than 32. In an optional embodiment, a grayscale not greater than 32 is referred to as a low grayscale, and a grayscale greater than 32 is referred to as a non-low grayscale. Generally, a pixel is prone to color shift in the low grayscales, so in the first display mode, the pixel may be controlled to emit light in the first manner. That is, the color sub-pixels in the pixel are controlled to emit light, and part of the white sub-pixels in the pixel are controlled to emit light, while the remaining white sub-pixels are turned off. In this way, the luminance of the pixel may be compensated by the white sub-pixels that emit light, such that the luminance of the pixel may meet the luminance requirement of the corresponding low grayscale, without reducing the current density of the light-emitting device, which helps solve the problem of color shift of the pixel. In addition, the pixel is usually not prone to color shift at non-low grayscales, so in the second display mode, the pixel may be controlled to emit light in the second manner. That is, all of the m color sub-pixels and the k white sub-pixels in the pixel are controlled to emit light. In this way, the luminance of the pixel may be compensated by the white sub-pixels that emit light, such that the luminance of the pixel is improved.

The embodiment of the present disclosure is illustrated by taking an explanation in which the grayscale not greater than 32 is a low grayscale and the grayscale greater than 32 is a non-low grayscale. In other embodiments, the boundary of the low grayscale may not be 32, for example, the boundary of the low grayscale may be 30, 25, 28, or the like, which is not limited in the embodiments of the present disclosure.

The above descriptions introduce the embodiment of the method for driving a display panel according to the present disclosure, and an embodiment of the present disclosure further provides a method for manufacturing a display panel. The display panel may be the display panel provided by any one of the above embodiments. The embodiment of the method for manufacturing the display panel of the present disclosure is described below.

Figure 5:
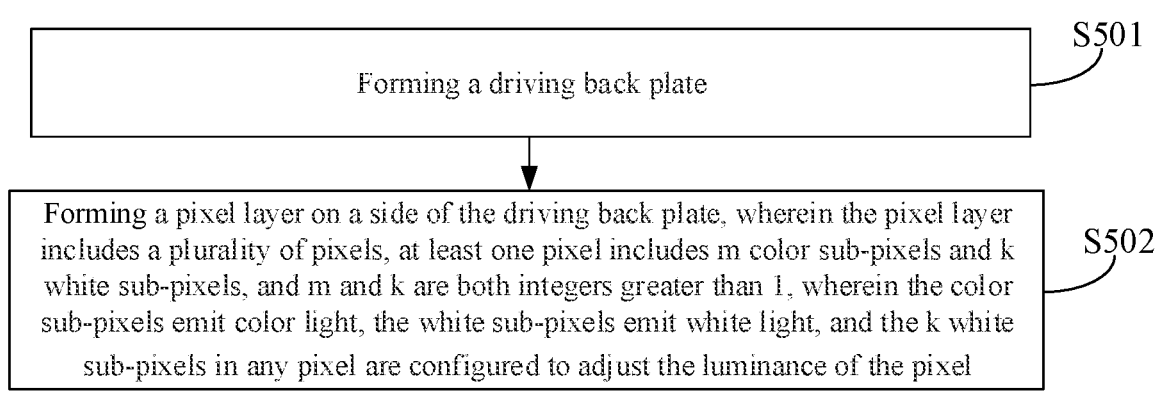
FIG. 5 is a flow chart of a method for manufacturing a display panel according to an embodiment of the present disclosure.

FIG. 5 is a flow chart of a method for manufacturing a display panel according to an embodiment of the present disclosure. As shown in FIG. 5, the method for manufacturing a display panel includes the following steps S501 to S502.

In step S501, a driving back plate is formed.

The driving back plate includes a driving circuit, and the driving circuit may include a pixel circuit and a peripheral circuit. The pixel circuit is disposed in a display region of the driving back plate and the peripheral circuit is disposed in a peripheral region of the driving back plate.

In an implementation, the driving back plate is a silicon substrate, and the silicon substrate is made from monocrystalline silicon or high-purity silicon. The driving circuit is integrated in the silicon substrate. Forming the driving back plate may include: acquiring a driving back plate by forming a driving circuit in the silicon substrate by a semiconductor process. The driving circuit includes a transistor, and an active layer and an electrode of the transistor may be formed on the silicon substrate by a doping process. An insulating layer may be formed by a silicon oxidation process, and a conductive layer for electrical connection between a wire and the transistor may be formed by a sputtering process.

In another implementation, the driving back plate includes a base substrate and a driving circuit disposed on the base substrate. The base substrate may be a rigid substrate or a flexible substrate. Forming the driving back plate may include: acquiring the driving back plate by forming a driving circuit on the base substrate by a photo-etching process. For example, an active layer, a gate, a source and a drain of the transistor are formed on the base substrate by a photo-etching process.

In step S502, a pixel layer is formed on a side of the driving back plate. The pixel layer includes a plurality of pixels, at least one pixel includes m color sub-pixels and k white sub-pixels, and m and k are both integers greater than 1. The color sub-pixels emit color light, the white sub-pixels emit white light, and the k white sub-pixels in any pixel are configured to adjust the luminance of the pixel.

Exemplarily, a pixel layer is formed on the side, provided with the driving circuit, of the driving back plate.

Optionally, the pixel layer includes a pixel defining layer and a plurality of light-emitting devices. Forming the pixel layer on a side of the driving back plate includes: forming the pixel defining layer and the plurality of light-emitting devices on a side of the driving back plate. The pixel defining layer is provided with a plurality of pixel openings, each light-emitting device is disposed in one pixel opening, and each of the color sub-pixels and the white sub-pixels in the pixel layer includes one light-emitting device.

Exemplarily, the light-emitting device includes a first electrode, a light-emitting functional layer and a second electrode that are sequentially laminated in a direction going away from the driving back plate. The first electrode is disposed on the side of the pixel defining layer proximal to the driving back plate, and both of the light-emitting functional layer and the second electrode are disposed on the side of the pixel defining layer distal from the driving back plate. Forming the pixel defining layer and the plurality of light-emitting devices on a side of the driving back plate includes: sequentially forming the first electrode, the pixel defining layer, the light-emitting functional layer and the second electrode on a side of the driving back plate.

Optionally, the plurality of light-emitting devices are all white light emitting devices, and the pixel layer further includes a color film layer. Forming the pixel layer on a side of the driving back plate further includes: forming the color film layer on the side of the light-emitting device distal from the driving back plate. The color film layer includes a plurality of light-transmitting portions, and the plurality of light-transmitting portions are in one-to-one correspondence with the plurality of light-emitting devices. The plurality of light-transmitting portions includes a filter portion and a transparent portion, each color sub-pixel in the pixel layer further includes one filter portion, and each white sub-pixel further includes one transparent portion.

Optionally, the pixel layer further includes an encapsulation structure disposed on the side of the light-emitting device distal from the driving back plate, and the color film layer is disposed on the side of the encapsulation structure distal from the driving back plate. Forming the pixel layer on a side of the driving back plate further includes: forming the encapsulation structure on the side of the light-emitting device distal from the driving back plate.

Correspondingly, forming the color film layer on the side of the light-emitting device distal from the driving back plate includes: forming the color film layer on the side of the encapsulation structure distal from the driving back plate.

Exemplarily, the encapsulation structure includes a first inorganic layer, an organic layer and a second inorganic layer that are sequentially laminated in a direction going away from the driving back plate. Forming the encapsulation structure on the side of the light-emitting device distal from the driving back plate includes: sequentially forming the first inorganic layer, the organic layer and the second inorganic layer on the side of the light-emitting device distal from the driving back plate. The first inorganic layer covers the side of the light-emitting device distal from the driving back plate, an orthographic projection of the organic layer onto the driving back plate falls within an orthographic projection of the first inorganic layer onto the driving back plate, and the second inorganic layer covers the organic layer and the part, not covered with the organic layer, of the first inorganic layer.

In summary, in the display panel manufactured by the method provided in the embodiment of the present disclosure, the pixel includes the m color sub-pixels for emitting color light and the k white sub-pixels for emitting white light, and the K white sub-pixels are configured to adjust the luminance of the pixel. Therefore, the luminance of the pixel can be adjusted by the k white sub-pixels to meet the luminance requirement of a corresponding grayscale, which helps prevent the pixel from color shift and thus prevents the display panel from color shift, compared with adjustment of the luminance of the pixel by adjusting the driving voltage.

In the method for manufacturing a display panel according to the embodiments of the present disclosure, the sequence of the steps can be adjusted appropriately, and the steps can also be added or removed according to the situation. Within the technical scope of the present disclosure, various methods easily derived by those skilled in the art shall be included in the scope of protection of the present disclosure.

The above descriptions introduce the embodiments of the method for manufacturing a display panel according to the present disclosure. Based on the same inventive concept, an embodiment of the present disclosure provides a display apparatus, including any of the display panels provided in the above embodiments. The display apparatus has the beneficial effects of the corresponding display panel, which is not repeated herein.

Optionally, the display apparatus is a mobile phone, a tablet computer, a smart watch, a television, a moving picture experts group audio layer IV (MP4) player, a notebook computer, a virtual reality device or the like, which is not listed one by one herein.

Other embodiments of the present disclosure may be apparent to those skilled in the art from consideration of the description and practice of the present disclosure. The present application is intended to cover any variations, uses, or adaptations of the present disclosure following the general principles thereof and including common knowledge or commonly used technical means which are not disclosed herein. The description and embodiments are to be considered as exemplary only, and the true scope and spirit of the present disclosure are indicated by the appended claims.

What is claimed is:

1. A display panel, comprising:
   a driving back plate, and a pixel layer disposed on a side of the driving back plate,
   wherein the pixel layer comprises a plurality of pixels, each pixel comprising m color sub-pixels for emitting color light and k white sub-pixels for emitting white light, the k white sub-pixels being configured to adjust luminance of the pixel, wherein m and k are both integers greater than 1; and
   wherein light-emitting surfaces of at least two of the k white sub-pixels have unequal areas;
   wherein the k white sub-pixels comprise a first white sub-pixel and (k-1) second white sub-pixels, and an area of a light-emitting surface of the first white sub-pixel is smaller than an area of a light-emitting surface of the second white sub-pixel; and
   wherein the area of the light-emitting surface of the first white sub-pixel is not greater than 20% of a sum of the areas of the light-emitting surfaces of the k white sub-pixels.

2. The display panel according to claim 1, wherein the m color sub-pixels and the (k-1) second white sub-pixels are arranged around the first white sub-pixel.

3. The display panel according to claim 2, wherein the area of the light-emitting surface of the second white sub-pixel equals an area of a light-emitting surface of the color sub-pixel.

4. The display panel according to claim 3, wherein an orthographic projection of the pixel onto the driving back plate, orthographic projections of the color sub-pixels onto the driving back plate and orthographic projections of the white sub-pixels onto the driving back plate are all rectangular.

5. The display panel according to claim 1, wherein the m color sub-pixels and the second white sub-pixels are arranged in a first direction, and the first white sub-pixel and the second white sub-pixels are arranged in a second direction, the first direction being perpendicular to the second direction.

6. The display panel according to claim 5, wherein an area of a light-emitting surface of any one of the m color sub-pixels equals a sum of the areas of the light-emitting surfaces of the k white sub-pixels.

7. The display panel according to claim 6, wherein an orthographic projection of the pixel onto the driving back plate, orthographic projections of the color sub-pixels onto the driving back plate and orthographic projections of the white sub-pixels onto the driving back plate are all rectangular.

8. The display panel according to claim 1, wherein the sub-pixels in the pixel are arranged in a plurality of rows in a second direction, and a plurality of sub-pixels are arranged in each row in a first direction.

9. The display panel according to claim 8, wherein an area of a light-emitting surface of any one of the m color sub-pixels equals a sum of the areas of the light-emitting surfaces of the k white sub-pixels.

10. The display panel according to claim 9, wherein shapes of orthographic projections of the color sub-pixels onto the driving back plate are all polygons, orthographic projections of the k white sub-pixels onto the driving back plate form the polygon, and the polygon has more than 4 edges.

11. The display panel according to claim 1, wherein the pixel layer comprises:
    a pixel defining layer disposed on a side of the driving back plate and provided with a plurality of pixel openings; and
    a plurality of light-emitting devices, wherein each light-emitting device is disposed in one pixel opening, and each of the color sub-pixels and the white sub-pixels comprises one the light-emitting device.

12. The display panel according to claim 11, wherein
    the light-emitting device is a white light emitting device, and
    the pixel layer further comprises:
    a color film layer disposed on sides of the plurality of light-emitting devices distal from the driving back plate, wherein the color film layer comprises a plurality of light-transmitting portions, and the plurality of light-transmitting portions are in one-to-one correspondence with the plurality of light-emitting devices;
    wherein the plurality of light-transmitting portions comprise a filter portion and a transparent portion, the color sub-pixel further comprises the filter portion, and the white sub-pixel further comprises the transparent portion.

13. The display panel according to claim 1, wherein the m color sub-pixels comprise a red sub-pixel, a green sub-pixel and a blue sub-pixel.

14. A method for driving a display panel, wherein the display panel comprises a driving back plate and a pixel layer disposed on a side of the driving back plate, the pixel layer comprising a plurality of pixels, the pixel comprising m color sub-pixels and k white sub-pixels, wherein the k white sub-pixels are configured to adjust luminance of the pixel, m and k being both integers greater than 1; the method comprising:
    controlling at least one of the plurality of pixels to emit light, such that the color sub-pixels in the at least one pixel emit color light, and the white sub-pixels in the at least one pixel emit white light; and
    wherein controlling at least one of the plurality of pixels to emit light comprises:

in a first display mode, controlling the at least one of the plurality of pixels to emit light in a first manner, wherein emitting light by any one pixel in the first manner comprises: emitting light by the color sub-pixels in the pixel, emitting light by part of the white sub-pixels in the pixel, and turning off the remaining white sub-pixels; and in a second display mode, controlling the at least one of the plurality of pixels to emit light in a second manner, wherein emitting light by any one pixel in the second manner comprises: emitting light by at least one color sub-pixel and the k white sub-pixels in the pixel.

15. The method according to claim 14, wherein the pixel has n grayscales, luminance of the pixel at an $i^{th}$ grayscale is lower than the luminance of the pixel at an $(i+1)^{th}$ grayscale, wherein the ith grayscale and the $(i+1)^{th}$ grayscale are any two adjacent grayscales of the n grayscales, n is a natural number not less than 256, and i is a natural number less than n; and the grayscale of any one pixel when emitting light in the first manner is not greater than 32.

16. A display apparatus, comprising a display panel, wherein the display panel comprises a driving back plate and a pixel layer disposed on a side of the driving back plate;

wherein the pixel layer comprises a plurality of pixels, the pixel comprising m color sub-pixels for emitting color light and k white sub-pixels for emitting white light, the k white sub-pixels being configured to adjust luminance of the pixel, wherein m and k are both integers greater than 1; and wherein light-emitting surfaces of at least two of the k white sub-pixels have unequal areas;

wherein the k white sub-pixels comprise a first white sub-pixel and (k-1) second white sub-pixels, and an area of a light-emitting surface of the first white sub-pixel is smaller than an area of a light-emitting surface of the second white sub-pixel; and wherein the area of the light-emitting surface of the first white sub-pixel is not greater than 20% of a sum of the areas of the light-emitting surfaces of the k white sub-pixels.

* * * * *